(12) United States Patent
Flores, Jr. et al.

(10) Patent No.: US 8,751,183 B2
(45) Date of Patent: Jun. 10, 2014

(54) TESTER HAVING SYSTEM MAINTENANCE COMPLIANCE TOOL

(75) Inventors: Nicholas Flores, Jr., Garland, TX (US); Richard G. Baker, Dallas, TX (US); Dennis H. Burke, Jr., Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 450 days.

(21) Appl. No.: 13/245,085

(22) Filed: Sep. 26, 2011

(65) Prior Publication Data

US 2013/0080107 A1 Mar. 28, 2013

(51) Int. Cl.
*G06F 19/00* (2011.01)
*G01R 31/3167* (2006.01)

(52) U.S. Cl.
CPC .................................. *G01R 31/3167* (2013.01)
USPC ........................................................ 702/117

(58) Field of Classification Search
CPC ....................... G01R 31/3167; G01R 31/31917
USPC ............................ 702/117, 118, 182–185, 188
See application file for complete search history.

(56) References Cited

U.S. PATENT DOCUMENTS 6,996,747 B2 * 2/2006 Swoboda et al. ............... 714/30
7,327,153 B2 2/2008 Weinraub

* cited by examiner

*Primary Examiner* — Edward Raymond
(74) *Attorney, Agent, or Firm* — Steven A. Shaw; Wade James Brady, III; Frederick J. Telecky, Jr.

(57) ABSTRACT

A tester module for automatic test equipment (ATE) includes test instruments for testing an integrated circuit device under test (DUT). A plurality of sensors include sensors coupled to or proximate to the test instruments for detecting a plurality of different maintenance triggers associated with the test instruments. A memory stores code including operating system code for controlling the test instruments and for implementing a system maintenance compliance tool. A processor is coupled to the test instruments the sensors and the memory. The processor runs the operating system code including the system maintenance compliance tool. The system maintenance compliance tool upon receiving notification of at least a first maintenance trigger automatically blocks the ATE being used for the testing. The system maintenance compliance tool can include a listing of needed maintenance actions associated with the maintenance triggers that when completed automatically releases the ATE to allow resumption of testing.

15 Claims, 3 Drawing Sheets

300

Autoflag/Diagnostics Utility

Status:
Cal on All Selected Slots, Fail Diags for Selected FAIL Slots/All Diags for Selected PASS Slots

| NIST | CAL (FAIL) | DIAG (FAIL) | Qd | Sl | Slot Type | Serial# | PCB | PWB | Board Type |
|---|---|---|---|---|---|---|---|---|---|
| ---- | ---- | Pass | NA | NA | S_SYSTEM | 0101003999 | C | C | S_X2_BACKPLANE |
| Pass | Pass | Pass | Q1 | S1 | S_PS | 0100086912 | N | R | S_OCTALDPS_EP |
| ---- | Pass | Pass | Q1 | S2 | S_PS | 0100078283 | M | N | S_UPMU_18BIT |
| ---- | Pass | Pass | Q1 | S3 | S_PS | 0100052624 | F | N | S_UPMU_18BIT |
| Pass | Pass | Pass | Q2 | S1 | S_PS | 0100081869 | N | R | S_OCTALDPS_EP |
| ---- | Pass | Pass | Q2 | S2 | S_PS | 0100004205 | L | L | S_UPMU_18BIT |
| ---- | Pass | Pass | Q2 | S3 | S_PS | 0100064674 | L | L | S_UPMU_18BIT |
| ---- | ---- | Pass | Q1 | S1 | S_PINCARD | 0100082699 | J | J | S_PINCARD_PLUS_RPT |
| ---- | ---- | Pass | Q1 | S2 | S_PINCARD | 0100077378 | L | P | S_PINCARD_PLUS_RPT |
| ---- | ---- | Pass | Q1 | S3 | S_PINCARD | 0100054160 | C | J | S_PINCARD_PLUS_RPT |
| ---- | ---- | Pass | Q1 | S4 | S_PINCARD | 0100078354 | J | P | S_PINCARD_PLUS_RPT |
| ---- | ---- | Pass | Q1 | S5 | S_PINCARD | 0100082696 | J | J | S_PINCARD_PLUS_RPT |
| ---- | ---- | Pass | Q1 | S6 | S_PINCARD | 0100069806 | J | J | S_PINCARD_PLUS_RPT |
| ---- | ---- | Pass | Q1 | S7 | S_PINCARD | 0100069814 | J | J | S_PINCARD_PLUS_RPT |
| ---- | ---- | Pass | Q1 | S8 | S_PINCARD | 0100055688 | C | J | S_PINCARD_PLUS_RPT |
| ---- | ---- | Pass | Q2 | S1 | S_PINCARD | 0100063719 | C | J | S_PINCARD_PLUS_RPT |
| ---- | ---- | Pass | Q2 | S2 | S_PINCARD | 0100047391 | C | J | S_PINCARD_PLUS_RPT |
| ---- | ---- | Pass | Q2 | S3 | S_PINCARD | 0100057593 | C | J | S_PINCARD_PLUS_RPT |
| ---- | ---- | Pass | Q2 | S4 | S_PINCARD | 0100022872 | C | J | S_PINCARD_PLUS_RPT |
| ---- | ---- | Pass | Q2 | S5 | S_PINCARD | 0100069809 | J | J | S_PINCARD_PLUS_RPT |
| ---- | ---- | Fail | Q2 | S6 | S_PINCARD | 0100054154 | C | J | S_PINCARD_PLUS_RPT |
| ---- | ---- | Pass | Q2 | S7 | S_PINCARD | 0100021869 | C | J | S_PINCARD_PLUS_RPT |
| ---- | ---- | Pass | Q2 | S8 | S_PINCARD | 0100057672 | C | J | S_PINCARD_PLUS_RPT |
| ---- | Pass | Pass | Q1 | S1 | S_DMA | 0100074286 | B | C | S_DMA_2XRD |
| ---- | Pass | Pass | Q2 | S1 | S_DMA | 0100074260 | B | C | S_DMA_2XRD |
| Pass | Pass | Pass | Q1 | S1 | S_EMUCLK | 0100076001 | D | F | S_PMMULTICLOCK |
| Pass | Pass | Pass | Q2 | S1 | S_EMUCLK | 0100075889 | D | F | S_PMMULTICLOCK |
| ---- | ---- | Pass | Q1 | S1 | S_FMSC | 0100007970 | B | K | S_FMSC_PGMDIV |
| ---- | Pass | Pass | Q1 | S1 | S_HSDIGAWG | 0100074212 | E | E | S_RFDIGAWG_QUAD |
| ---- | Pass | Pass | Q2 | S1 | S_HSDIGAWG | 0100067637 | C | E | S_RFDIGAWG_QUAD |
| ---- | Fail | Fail | Q2 | S1 | S_LPS | 0100075983 | E | G | S_LPS |

Select: ◇ All  ◇ Auto  ◇ None    Show: ◇ All  ◇ Fails Only

[Apply]  [Resume]  [Exit]  [Help]

[AutoSet Status...]  [Preview Set...]

*FIG. 3*

TESTER HAVING SYSTEM MAINTENANCE COMPLIANCE TOOL

FIELD

Disclosed embodiments relate to automatic test equipment used to test integrated circuit devices, and more particularly for operating systems for such automatic test equipment.

BACKGROUND

Automatic test equipment is generally used to test semiconductor devices and integrated circuit (IC) elements, such as memory or logic, for manufacturing defects. Manufacturers of automatic test equipment (ATE) offer test systems to address the increasingly complex task of testing advanced ICs. However, many commercially available ATE systems are complex, proprietary, not easily flexible to meet changing test conditions, often require additional heat removal systems, and typically cost several million dollars that make them unattractive for use in a cost driven manufacturing environment.

Testing devices during production generally requires an appropriate tester to test an IC device. During production of IC devices, various tests may be performed. A test system allows a test assembly to interface with an IC device using an interface apparatus.

Conventional ATE tests a "device under test" referred to as a "DUT." A conventional ATE for testing a DUT includes a tester module that is operable to communicate test signals to the DUT through a test head via one or more electrical couplers, such as conductors, cables, lines pins, links, traces, and/or busses. The tester module generally includes various electronic test instruments (hardware), such as AC and DC electrical signal generators for applying electrical signals through digital and/or analog channels to a DUT on the test head. The tester module includes various measurement instruments including sensors that receive and analyze digital or analog test data signals generated by the DUT that are transmitted out of the DUT. The tester module also includes an operating system that comprises software that controls operations of the tester, including software calibration and diagnostic flags for all of its instruments.

For every DUT that is designed and manufactured, test hardware called a test interface board or "load board" is built for production tests. The DUT is mounted onto the load board via a socket. Configurations of a load board can vary depending on the type, size, and quantity of DUTs being tested.

The tester communicates instructions and test programs to the test head, which applies analog test signals to architectures of DUT through load board using connectors between the DUT I/O (Input/Output) ports and load board. The DUT receives analog test signals from the load board, processes the signals according to a test procedure, and transmits the processed test signals back to the load board, which transmits the test data through the test head and back to the tester for further analysis by the tester.

Conventionally, maintenance (e.g., calibration or replacement) is performed during the life of the test system, generally being time-driven on a periodic basis (e.g., monthly, quarterly (more extensive) and yearly (most extensive)) to minimize the quality risk defined as shipping (passing) bad/defective product to customers. Improper maintenance can result in an increase in quality risk. Improper system maintenance can also result in rejection or scrap of good product.

SUMMARY

Disclosed embodiments recognize operating system overrides to automatic test equipment (ATE) for testing devices under test (DUTs) can result in an increase in the quality risk described above. Disclosed operating system code includes what is referred to herein as a system maintenance compliance tool. When starting a production test operation, disclosed system maintenance compliance tools automatically check the installed ATE hardware, and then the system calibration and diagnostic status of the hardware is determined. If the operating system detects the presence of at least one of a plurality of stored conditions referred to herein as "maintenance triggering conditions" that have been predetermined to compromise the integrity of testing by the ATE, such as new hardware installed or an expired calibration/diagnostic time interval, the system maintenance compliance tool prevents the ATE from being used for production testing, including preventing any attempted (e.g., operator or test technician) override. Disclosed system maintenance compliance tools thus prevent overrides to the operating system that for conventional operating systems can add to the quality risk by permitting release of the ATE for production testing despite the presence of a maintenance triggering condition.

Disclosed system maintenance compliance tools can include a listing of needed maintenance actions associated with the respective maintenance triggers, wherein upon receiving notification of successful completion of the needed maintenance action can automatically unlock (release) the ATE to allow a resumption of testing. A needed maintenance action can be prompted by a variety of events or conditions, such as hardware device replacement without confirmation of proper operation/functionality of the replacement hardware device, a power supply adjustment/drift beyond a predetermined limit, or system interruptions (e.g., excessive power up/down sequences, hardware reseating). Disclosed embodiments also include tester modules for ATEs and ATEs that have operating system code including disclosed system maintenance compliance tools.

BRIEF DESCRIPTION OF THE DRAWINGS

FIG. 3 is a scanned snapshot of an example AutoSet window that shows two boards that failed diagnostics, and in addition one board that also failed calibration, according to an example embodiment.

DETAILED DESCRIPTION

Figure 1:
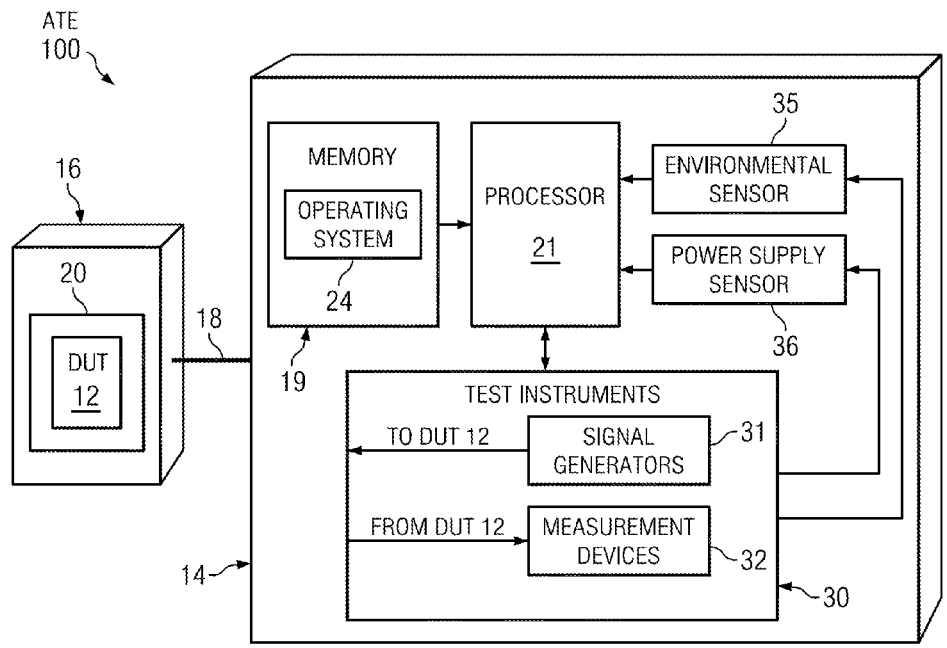
FIG. 1 is a block diagram of example ATE that includes an operating system that implements a disclosed system maintenance compliance tool, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a block diagram of an example ATE 100 that includes a tester module that runs disclosed operating system code that includes a disclosed system maintenance compliance tool, according to an example embodiment. Upon receiving notification of at least one maintenance triggering condition being present, disclosed maintenance compliance tools provide automatic ATE test blocking, including blocking of attempted manual overrides. Accordingly, production testing is prevented when a maintenance triggering condition is present. Example maintenance triggers can comprise power supply parameters.

Disclosed maintenance compliance tools also provide monitoring for successful remediation of the maintenance triggering condition by its needed maintenance action that can automatically release the ATE to allowing resumption of testing. Disclosed maintenance compliance tools can be included or added to retrofit the operating system code for generally any tester or test system.

Although not shown, to automatically and simultaneously load and unload a plurality of DUTs 12 to and from sockets on a load board 20, a robotic handling machine referred to as a handler (not shown) can be included with ATE 100. The handler also sorts the failing DUTs from passing DUTs after testing is performed by ATE 100.

The ATE 100 shown in FIG. 1 includes a tester module 14 that is operable to communicate test signals to the DUT 12 through a test head 16 via one or more electrical couplers 18 such as conductors, cables, lines pins, links, traces, and/or busses. The tester module 14 includes a memory 19 that stores code including code for controlling the ATE 100 including operating system code 24 that includes a disclosed system maintenance compliance tool, and a processor (e.g., microprocessor) 21 that implements the operating system code 24.

The tester module 14 has various test instruments (hardware) 30 including signal generators 31 such as AC and DC electrical signal generators for applying electrical test signals through digital and/or analog channels to the DUT 12 on the test head 16. Test instruments 30 also include measurement devices 32 for receiving and analyzing data from tests performed on the DUT 12.

The test instruments 30 can include analog voltage/current sources, digital pin and clock electronics, digital timing references, time-measurement units, voiceband and baseband mixed-signal test instruments (e.g., digitizers, arbitrary waveform generators). Test hardware referred to as a test interface board or "load board" 20 is built for production tests. Tester module 14 interfaces to DUT 12 through load board 20 that is attached to the test head 16. The DUT 12 is mounted onto the load board 20 via a socket. Configurations of the load board 20 can vary depending on the type, size, and quantity of DUTs being simultaneously tested.

The tester module 14 also includes a plurality of sensors including sensors coupled to or proximate to the test instruments 30 for detecting a plurality of different maintenance triggers associated with one or more of the test instruments. Power supply sensor 36 can monitor internal power supply levels and environmental sensor 35 can monitor environmental conditions including temperature proximate to the test instruments.

Tester module 14 communicates instructions and test programs to the test head 16, where signal generators 31 apply analog test signals to architecture of DUT 12 through load board 20 using connectors between the DUT 12 I/O (Input/Output) ports and load board 20. Load board 20 may comprise one or more RF connectors, where each connector is operable to communicate an RF test signal to DUT 12, and also may include high-speed test signals through hard-wired connections. DUT 12 receives analog test signals from the load board 20, processes the signals according to a test procedure, and transmits the processed test signals back to the load board 20, which transmits the test data through the test head 16 and back to the measurement devices 32 for further analysis by the tester module 14.

Disclosed maintenance compliance tools reduce the quality risk by minimizing or eliminating testing while the ATE is experiencing improper system maintenance. As noted above, quality risk refers to shipping (passing) bad/defective product to customers. Improper system maintenance can also result in reject or scrap of good product. Improper system maintenance can include replacing one or more hardware components with replacement hardware in test instruments 30 and not confirming proper operation/functionality of the replacement hardware before releasing the ATE for use, allowing operation of the ATE beyond predetermined (e.g., recommended) time limits at which time system performance is no longer guaranteed, and excessive system interruptions, i.e. power up/down cycles, hardware reseating, etc without verification of system operations.

Figure 2:
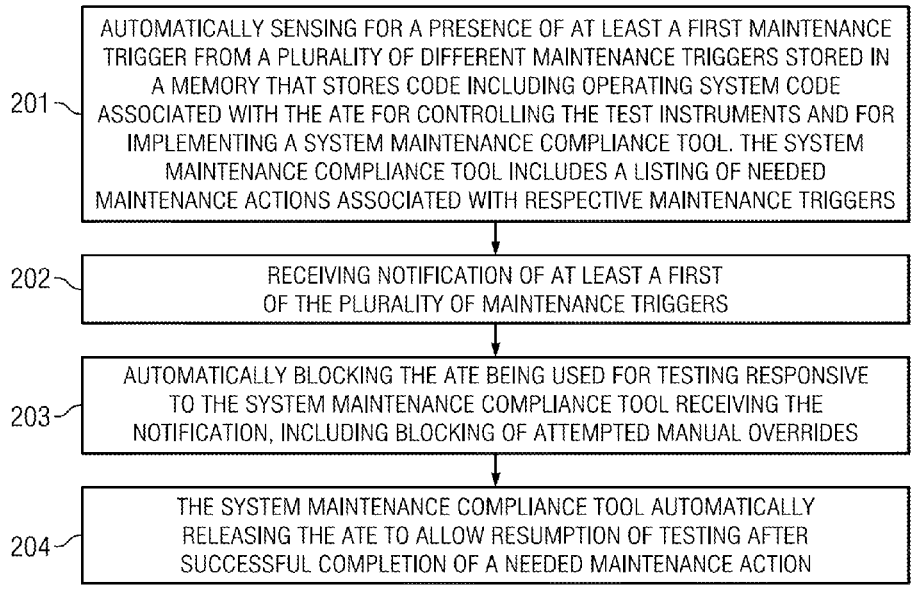
FIG. 2 is a flow chart for an example method of testing integrated circuit devices using an ATE that includes automatically blocking of the operation of the ATE upon sensing the presence of a maintenance triggering condition, according to an example embodiment.

FIG. 2 is a flow chart for an example method 200 of testing at least one integrated circuit DUT using ATE including a tester module having test instruments operable for testing the DUT, according to an example embodiment. Step 201 comprises automatically sensing for a presence of at least a first maintenance trigger from a plurality of different maintenance triggers stored in a memory that stores code including operating system code associated with the ATE for controlling the test instruments and for implementing a system maintenance compliance tool. As disclosed above, maintenance triggers can include the installation of at least one replacement hardware device in the test instruments without confirming proper operation/functionality of the replacement hardware device after the installing, operation of the ATE beyond a predetermined time limit (e.g., without maintenance being performed), and more than a predetermined number of interruptions of the ATE (e.g., power up/down cycles, hardware reseating) without verification of proper operation of the ATE after the predetermined number of interruptions.

Step 202 comprises receiving notification of at least a first of the plurality of maintenance triggers. Such notification can come from, for example, sensors such as the environmental sensor 35 or power supply sensor 36 shown in FIG. 1, or a timer or counter (e.g., that counts a number of interruptions). Step 203 comprises automatically blocking the ATE being used for testing responsive to the system maintenance compliance tool receiving the notification, including blocking of attempted manual overrides.

Once blocked, the operating system code does not run, which can prevent the loading of DUTs (e.g., from a handler) onto the tester, and testing the DUTs. As disclosed above, the system maintenance compliance tool can include a listing of needed maintenance actions associated with respective maintenance triggers. Step 204 can comprise the system maintenance compliance tool automatically releasing the ATE to allow resumption of testing after successful completion of the needed maintenance action.

In typical operation of ATE 100, disclosed operating system code provides automatic software calibration and diagnostic flags for the various hardware within test instruments 30. The diagnostic flags can be set to a "pass" status by the system maintenance tool allowing ATE test operations when these programs are successfully executed. When the operating system detects instrumentation changes or tester environment changes indicating needed maintenance, the flags can be reset which indicates ATE test operations being blocked.

Instrument changes are specifically hardware replacements. Tester environment changes relate to system power supply setting changes (e.g., level or noise/AC component for DC supplies), although temperature and humidity are other environmental components that affect electronic performance. The operating system blocks production testing by the ATE until the proper maintenance actions are taken, and as a result the system flags can be restored to pass.

Disclosed system maintenance tools can include a feature which automatically determines the maintenance procedures needed to verify or restore the ATE to production-use status. As disclosed above, the tester module includes sensors such as power supply sensor 36 that can monitor internal power supply levels and environmental sensor 35 that monitors environmental conditions including temperature. Automatic system power down can occur when any of these settings sensed by the sensors go beyond predetermined operating limits.

Adjustment of the power supplies of ATE 100 can be controlled by the tester calibration program. Whenever any adjustment or change is made to the system (power) supplies, the calibration program can reset the calibration flags. The operating system can interrogate the calibration/diagnostic flags at the beginning of any operation and can automatically block production use (e.g., keypad entry will not initiate testing) until the calibration is restored and verified.

Figure 4:
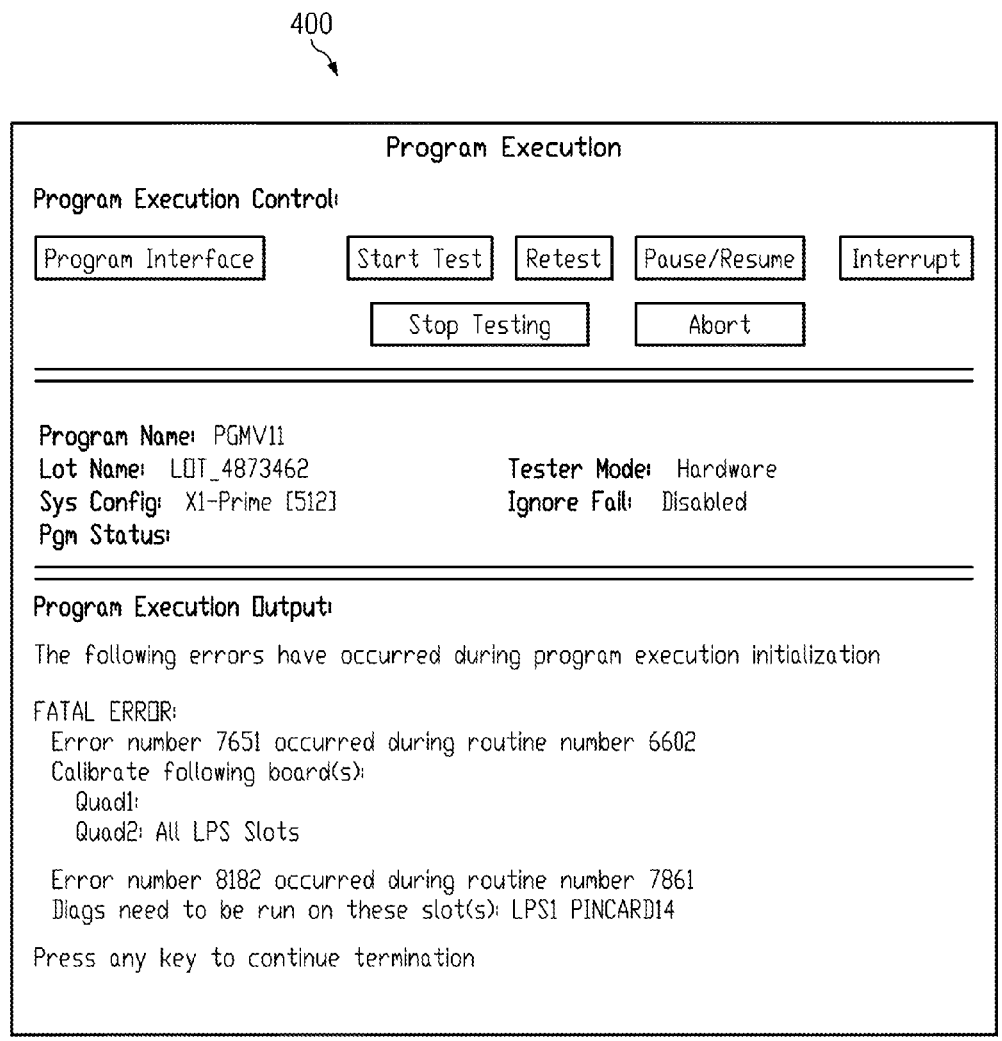
FIG. 4 is a scanned snapshot that shows a type of fatal error that would prevent system operation when the triggering conditions shown in FIG. 3 are present, according to an example embodiment.

FIG. 3 is a scanned snapshot of an example AutoSet window 300 that shows two boards (the highlighted rows) that failed diagnostics (DIAG), and in addition one board in one of the highlighted rows that also failed calibration (CAL), according to an example embodiment. Board status is the basis for types of example triggering conditions that disclosed operating systems can monitor to determine system status and block the ATE being used for testing, including blocking manual overrides if attempted, when at least one maintenance trigger is present. FIG. 4 is a scanned snapshot 400 that shows a type of fatal error that would prevent system operation when the triggering conditions shown in FIG. 3 are present, according to an example embodiment.

Disclosed embodiments can be integrated into a variety of test flows that test a variety of different semiconductor devices and related products. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. Automatic test equipment (ATE) for testing integrated circuit (IC) devices, comprising:
   a load board attached to a test head for mounting at least one IC device under test (DUT) via a socket on said load board;
   a tester module including:
      test instruments operable for testing said DUT including communicating test signals to said DUT and receiving test data signals generated by said DUT responsive to said test signals through said test head via one or more electrical couplers;
      a plurality of sensors including sensors coupled to or proximate to said test instruments for detecting a plurality of different maintenance triggers associated with one or more of said test instruments;
      a memory that stores code including operating system code for controlling said test instruments and for implementing a system maintenance compliance tool, and
      a processor coupled to said test instruments, said plurality of sensors, and said memory, wherein said processor runs said operating system code including said system maintenance compliance tool;
   wherein said system maintenance compliance tool upon receiving notification of at least a first of said plurality of maintenance triggers automatically blocks said ATE being used for said testing.

2. The ATE of claim 1, wherein said system maintenance compliance tool includes a listing of needed maintenance actions associated with respective ones of said plurality of different maintenance triggers, and wherein upon successful completion of said needed maintenance action said system maintenance compliance tool automatically releases said ATE to allow resumption of said testing.

3. The ATE of claim 1, wherein said plurality of different maintenance triggers include at least one of:
   installing at least one replacement hardware device in said test instruments without confirming proper operation/functionality of said replacement hardware device after said installing;
   operation of said ATE beyond a predetermined time limit, and
   more than a predetermined number of interruptions of said ATE without verification of proper operation of said ATE after said predetermined number of interruptions.

4. The ATE of claim 1, wherein said plurality of different maintenance triggers include:
   installing at least one replacement hardware device in said test instruments without confirming proper operation/functionality of said replacement hardware device after said installing;
   operation of said ATE beyond a predetermined time limit, and
   more than a predetermined number of interruptions of said ATE without verification of proper operation of said ATE after said predetermined number of interruptions.

5. The ATE of claim 1, wherein said plurality of sensors include at least one power supply sensor.

6. A tester module for automatic test equipment (ATE) including a load board attached to a test head for mounting at least one integrated circuit device under test (DUT) via a socket on said load board, said tester module comprising:
   test instruments operable for testing said DUT including communicating test signals to said DUT and receiving test data signals generated by said DUT responsive to said test signals through said test head via one or more electrical couplers;
   a plurality of sensors including sensors coupled to or proximate to said test instruments for detecting a plurality of different maintenance triggers associated with one or more of said test instruments;
   a memory that stores code including operating system code for controlling said test instruments and for implementing a system maintenance compliance tool, and
   a processor coupled to said test instruments, said plurality of sensors and said memory, wherein said processor runs said operating system code including said system maintenance compliance tool;
   wherein said system maintenance compliance tool upon receiving notification of at least a first of said plurality of maintenance triggers automatically blocks said ATE being used for said testing.

7. The tester module of claim 6, wherein said system maintenance compliance tool includes a listing of needed maintenance actions associated with respective ones of said plurality of different maintenance triggers, and wherein upon successful completion of said needed maintenance action said system maintenance compliance tool automatically releases said ATE to allow resumption of said testing.

8. The tester module of claim 6, wherein said plurality of different maintenance triggers include at least one of:
   installing at least one replacement hardware device in said test instruments without confirming proper operation/functionality of said replacement hardware device after said installing;
   operation of said ATE beyond a predetermined time limit, and
   more than a predetermined number of interruptions of said ATE without verification of proper operation of said ATE after said predetermined number of interruptions.

9. The tester module of claim 6, wherein said plurality of different maintenance triggers include:
   installing at least one replacement hardware device in said test instruments without confirming proper operation/functionality of said replacement hardware device after said installing;
   operation of said ATE beyond a predetermined time limit, and
   more than a predetermined number of interruptions of said ATE without verification of proper operation of said ATE after said predetermined number of interruptions.

10. The tester module of claim 6, wherein said plurality of sensors include at least one power supply sensor.

11. A method of testing at least one integrated circuit device under test (DUT) using automatic test equipment (ATE) including a tester module having test instruments operable for testing said DUT, comprising:
   automatically sensing for a presence of at least a first maintenance trigger from a plurality of different maintenance triggers stored in a memory that stores code including operating system code associated with said ATE for controlling said test instruments and for implementing a system maintenance compliance tool,
   receiving notification of at least a first of said plurality of maintenance triggers, and
   automatically blocking said ATE being used for said testing responsive to said system maintenance compliance tool receiving said notification.

12. The method of claim 11, wherein said system maintenance compliance tool includes a listing of needed maintenance actions associated with respective ones of said plurality of different maintenance triggers, and wherein upon successful completion of said needed maintenance action, said system maintenance compliance tool automatically releases said ATE to allow resumption said testing.

13. The method of claim 11, wherein said plurality of different maintenance triggers include at least one of:
   installing at least one replacement hardware device in said test instruments without confirming proper operation/functionality of said replacement hardware device after said installing;
   operation of said ATE beyond a predetermined time limit, and
   more than a predetermined number of interruptions of said ATE without verification of proper operation of said ATE after said predetermined number of interruptions.

14. The method of claim 11, wherein said plurality of different maintenance triggers include:
   installing at least one replacement hardware device in said test instruments without confirming proper operation/functionality of said replacement hardware device after said installing;
   operation of said ATE beyond a predetermined time limit, and
   more than a predetermined number of interruptions of said ATE without verification of proper operation of said ATE after said predetermined number of interruptions.

15. The method of claim 11, wherein said plurality of different maintenance triggers includes at least one power supply parameter.

\* \* \* \* \*